United States Patent
Donley et al.

(10) Patent No.: US 9,793,919 B1
(45) Date of Patent: Oct. 17, 2017

(54) COMPRESSION OF FREQUENT DATA VALUES ACROSS NARROW LINKS

(71) Applicant: Advanced Micro Devices, Inc., Sunnyvale, CA (US)

(72) Inventors: Greggory D. Donley, San Jose, CA (US); Vydhyanathan Kalyanasundharam, San Jose, CA (US); Bryan P. Broussard, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 15/373,105

(22) Filed: Dec. 8, 2016

(51) Int. Cl.
| | | |
|---|---|---|
| *H03M 7/00* | (2006.01) | |
| *H03M 7/30* | (2006.01) | |
| *H04B 1/40* | (2015.01) | |
| *H04L 27/26* | (2006.01) | |
| *H04L 1/06* | (2006.01) | |
| *H04L 1/00* | (2006.01) | |
| *H04L 25/02* | (2006.01) | |

(52) U.S. Cl.
CPC .............. *H03M 7/30* (2013.01); *H04B 1/40* (2013.01); *H04L 1/0003* (2013.01); *H04L 1/0618* (2013.01); *H04L 25/0266* (2013.01); *H04L 27/2647* (2013.01)

(58) Field of Classification Search
CPC .... H03M 7/30; H04L 25/0266; H04L 1/0618; H04L 1/0003; H04L 27/2647; H04B 1/40
USPC ........... 341/51; 375/220, 219, 295, 316, 267
See application file for complete search history.

(56) References Cited

U.S. PATENT DOCUMENTS

| | | |
|---|---|---|
| 5,974,471 A | 10/1999 | Belt |
| 6,115,732 A | 9/2000 | Oberman et al. |
| 2009/0041100 A1* | 2/2009 | Kimmich .............. H04L 1/0003 375/220 |

* cited by examiner

*Primary Examiner* — Joseph Lauture
(74) *Attorney, Agent, or Firm* — Rory D. Rankin; Meyertons, Hood, Kivlin, Kowert & Goetzel, P.C.

(57) ABSTRACT

Systems, apparatuses, and methods for compression of frequent data values across narrow links are disclosed. In one embodiment, a system includes a processor, a link interface unit, and a communication link. The link interface unit is configured to receive a data stream for transmission over the communication link, wherein the data stream is generated by the processor. The link interface unit determines if blocks of data of a first size from the data stream match one or more first data patterns and the link interface unit determines if blocks of data of a second size from the data stream match one or more second data patterns. The link interface unit sends, over the communication link, only blocks of data which do not match the first or second data patterns.

17 Claims, 12 Drawing Sheets

| Encoding Field 515 | | Data Pattern 520 |
|---|---|---|
| Was a Pattern Detected in the Cache Line? 505 | Which Pattern was Detected? 510 | |
| 1 | 00 | Upper Half of Each Data Block of a First Size = All 0's |
| 1 | 01 | Upper Half of Each Data Block of the First Size = All 1's |
| 1 | 10 | Upper Half of Each Data Block of a Second Size = All 0's |
| 1 | 00 | Upper Half of Each Data Block of the Second Size = All 1's |
| 0 | — | No Pattern Detected |

Table 500

FIG. 5

Table 600

| Encoding Field 605 | Corresponds to 610 |
|---|---|
| 00 | No Pattern Detected |
| 01 | Upper Half of Each Data Block = All 0's |
| 10 | Upper Half of Each Data Block = All 1's |
| 00 | Every Other Data Block = All 0's |

Table 620

| Encoding Field 625 | Corresponds to 630 |
|---|---|
| 0 | No Pattern Detected |
| 1 | The Single Pattern is Detected |

FIG. 6

| Application Type 705 | Pattern Detection Scheme 710 |
|---|---|
| Web Server | Dynamic Pattern Detection |
| Database | Fixed Pattern Detection: 4 Patterns |
| Virtualization | Fixed Pattern Detection: 3 Patterns |
| Multimedia | Fixed Pattern Detection: 1 Patterns |

Table 700

FIG. 7

COMPRESSION OF FREQUENT DATA VALUES ACROSS NARROW LINKS

BACKGROUND

Description of the Related Art

Electrical components on separate die communicate with each other over links between the die. The bandwidth between die is limited by physical distance, electrical characteristics of off-chip connections, and the limited availability of pins. The frequency at which data is transmitted on the link along with the width of the link (in terms of bits of data transferred) defines the bandwidth on the link. Increasing the signal count or the frequency of the link are ways of increasing the bandwidth, but both have cost and technology implications that prevent them from scaling efficiently.

BRIEF DESCRIPTION OF THE DRAWINGS

The advantages of the methods and mechanisms described herein may be better understood by referring to the following description in conjunction with the accompanying drawings, in which:

FIG. 5 illustrates one embodiment of a table indicating encoding fields for compressed data blocks.

FIG. 6 illustrates examples of two encoding tables.

FIG. 7 illustrates one embodiment of a table with pattern detection schemes implemented for different types of applications.

DETAILED DESCRIPTION OF EMBODIMENTS

Figure 1:
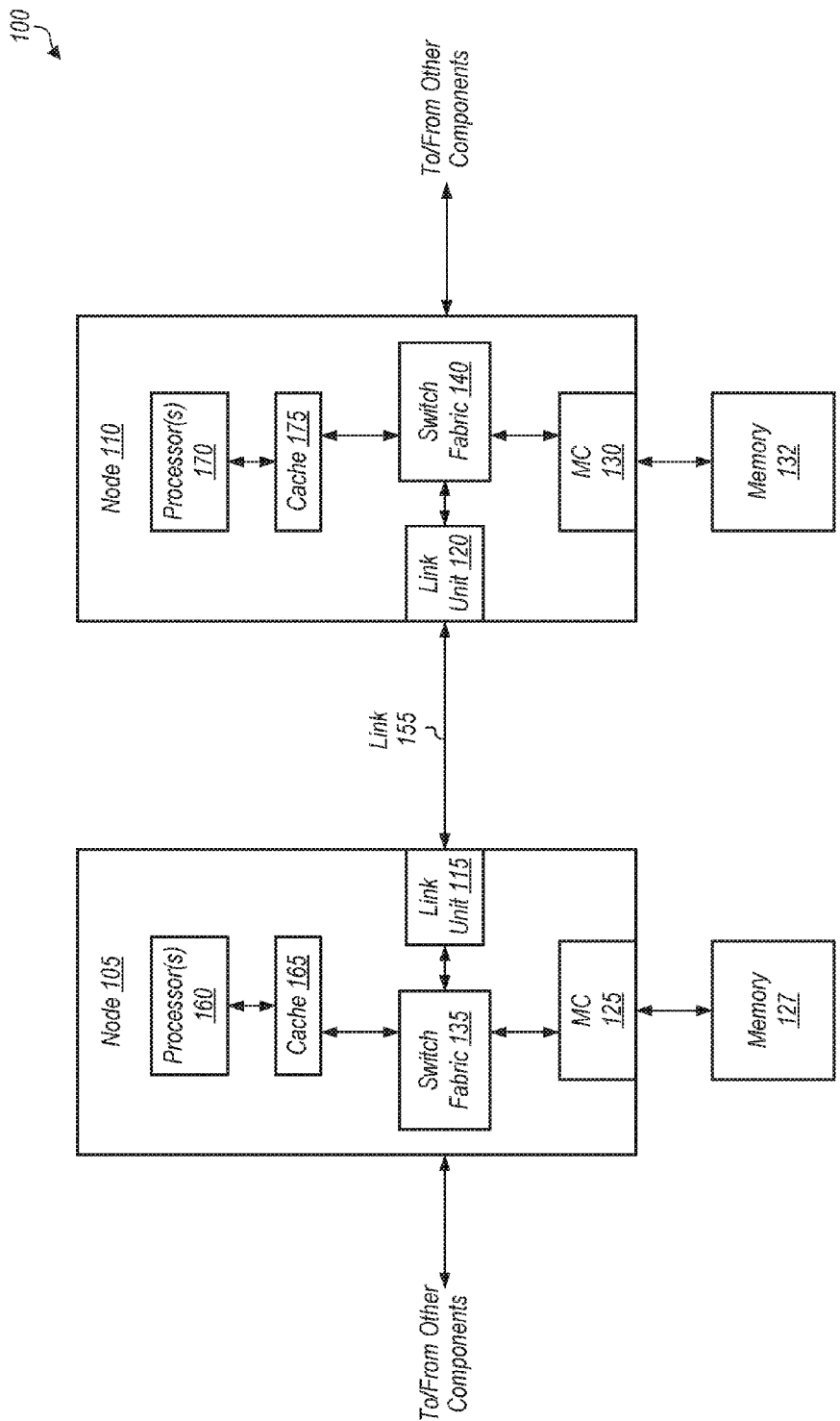
FIG. 1 is a block diagram of one embodiment of a computing system.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for compressing frequent data values across narrow links are disclosed. In one embodiment, a system includes at least a processor, a link interface unit, and a communication link. In one embodiment, the link interface unit is configured to receive a data stream for transmission over the communication link, wherein the data stream is generated by the processor. In one embodiment, the data stream includes one or more cache lines of data. In one embodiment, the link interface unit utilizes two different ways of partitioning a cache line of data. The link interface unit partitions the cache line into blocks of data of a first size and then determines if every other block of the cache line matches any of one or more patterns. In one embodiment, the first size is 32 bits. In one embodiment, one of the patterns is all of the bits equal to zero. If every other block matches a given pattern of the one or more patterns, then the link interface unit only sends the other blocks over the communication link. This reduces the amount of data sent over the communication link by one half. If every other block does not match any of the one or more patterns, then the link interface unit partitions the cache line into blocks of data of a second size and then determines if every other block of the second size of the cache line matches any of one or more patterns. In one embodiment, the second size is 16 bits. If every other block matches a given pattern of the one or more patterns, then the link interface unit only sends the other blocks over the communication link. The link interface unit also sends, over the communication link, an encoding field to indicate which given pattern every other block matches and to indicate the size of the block so that the receiver can reconstruct the original data. If every other block does not match any of the one or more patterns, then the link interface unit sends the entire cache line of data over the communication link.

In one embodiment, the link interface unit is configured to monitor the data stream to dynamically determine which data patterns occur frequently within the data stream over a first period of time. Next, the link interface unit determines if blocks of data of a first size within the data stream match a third data pattern responsive to determining that the third data pattern is a frequently occurring data pattern within the data stream over the first period of time, wherein the third data pattern is different from the one or more first or second data patterns. In one embodiment, a frequently occurring data pattern is a data pattern which occurs more than a threshold number of times in the first period of time.

In one embodiment, the system changes the pattern detection scheme implemented to compress data based on the type of software application being executed by the processor (s) of the system. For example, in one embodiment, the link interface unit implements a first pattern detection scheme when compressing data associated with a first software application, and the link interface unit implements a second pattern detection scheme when compressing data associated with a second software application, wherein the second pattern detection scheme is different from the first pattern detection scheme. Additionally, the link interface unit implements any number of other pattern detection schemes for other types of software applications.

Referring now to FIG. 1, a block diagram of one embodiment of a computing system 100 is shown. In one embodiment, system 100 includes multiple nodes, with nodes 105 and 110 shown in FIG. 1. It is noted that system 100 can include additional nodes with similar circuitry to that shown for nodes 105 and 110. Nodes 105 and 110 are coupled together via communication link 155. Depending on the embodiment, communication link 155 can be a bi-directional or uni-directional link. Depending on the embodiment, the width of link 155 has varying widths (e.g., 16 bits). In one embodiment, node 105 is formed on a first integrated circuit die and node 110 is formed on a second integrated circuit die, with link 155 providing the interconnect between the first and second die.

Nodes 105 and 110 are representative of any number and type of computing nodes. Generally speaking, a node 105 or 110 is defined as an apparatus or system with at least one computing/processing element (e.g., processor, processor core, programmable logic device, application specific integrated circuit) and at least one memory device. The at least one computing element of the node is configured to execute instructions and/or perform one or more types of computations (e.g., floating point, integer, memory, I/O) depending on the embodiment. The components of each node 105 and 110 are interconnected by one or more communication buses or fabrics (e.g., switch fabrics 135 and 140, respectively). In one embodiment, the functionality of each node 105 and 110 is incorporated into a single integrated circuit. In another embodiment, the functionality of each node 105 and 110 is incorporated in a chipset on a computer motherboard. In one embodiment, each node 105 and 110 is a stand-alone system within a mobile computer, a desktop, a server, or other device or system. In another embodiment, each node 105 and 110 is a socket of a multi-socket system 100. In a further embodiment, each node 105 and 110 is a separate die of a multi-die system 100.

In one embodiment, nodes 105 and 110 implement a packet-based interface for communication on link 155. Generally, the packets are transmitted as one or more bit times on link 155. In one embodiment, a given bit time can be referenced to the rising or falling edge of a clock signal. In another embodiment, link 155 does not include a clock signal. Instead, the clock is recovered from detecting transitions on the data lines. In one embodiment, link 155 is more narrow than the packet interface. In this embodiment, a packet is spread out over many bit times on link 155.

In various embodiments, link units 115 and 120 are configured to implement techniques to reduce (i.e., compress) the amount of data sent over link 155. It is noted that link units 115 and 120 can also be referred to as link interface units. In one embodiment, a technique for detecting frequently occurring patterns of data in the data sent over link 155 is implemented. On node 105, link unit 115 is configured to determine if processor generated data which will be conveyed over link 155 includes one or more frequently occurring data patterns. In one embodiment, the processor generated data which will be sent over link 155 is stored in a buffer in link unit 115 prior to being sent over link 155. Link unit 115 is configured to construct command and data packets for conveyance over link 155 with the processor generated data stored in the buffer. In one embodiment, if a data pattern is detected in the data sent from processor(s) 160 to link unit 115, then the data is compressed before being sent over link 155. In one embodiment, if the data matches a pattern of fixed portions alternating with variable portions, then only the variable portions of the data are sent on link 155. For example, in one embodiment, a cache line of data includes multiple data words, and if the upper half of each data word matches a pattern (e.g., all zeroes), then only the lower half of each data word is sent on link 155. In this way, the amount of data sent on link 155 is reduced by half, reducing power consumption and improving efficiency of the link 155. In one embodiment, encoding fields are generated in command packets to indicate which pattern the fixed portions matched and to indicate the size of the fixed portions. For example, in one embodiment, the size of the fixed portions is either 16 bits or 32 bits. In other embodiments, other sizes can be utilized.

When link unit 115 or 120 receives compressed packets sent over link 155, the link unit is configured to reconstruct the data payload from the variable portions of data words in the data packet and the encoding fields in the corresponding command packet. When the control logic at the receiver is reconstructing the data payload, if an encoding field indicates that a given data pattern was detected, then the control logic generates the fixed portions with the specified data pattern and inserts the fixed portions in the data payload at locations adjacent to the variable portions.

Node 105 includes at least processor(s) 160 coupled to cache 165 and switch fabric 135. Processor(s) 160 can also include one or more internal caches. Processor(s) 160 are representative of any number and type of processors (e.g., central processing unit (CPU), graphics processing unit (GPU)) with any number of cores. Each processor core includes one or more execution units, cache memories, schedulers, branch prediction circuits, and so forth. In one embodiment, the processor(s) 160 are configured to execute the main control software of node 105, such as an operating system. Generally, software executed by processor(s) 160 during use can control the other components of node 105 to realize the desired functionality of node 105. Processor(s) 160 can also execute other software, such as application programs.

Switch fabric 135 is coupled to memory controller (MC) 125 and link unit 115. Switch fabric 135 is a communication fabric that routes messages between the components of node 105. Memory controller 125 is coupled to memory 127, which is representative of any number and type of memory modules or devices. In some embodiments, memory 127 includes one or more memory devices mounted on a motherboard or other carrier upon which other components of node 105 are also mounted. In some embodiments, at least a portion of memory 127 is implemented on the die of node 105. The memory devices used to implemented memory 127 include (but are not limited to) random access memory (RAM), static RAM (SRAM), dynamic RAM (DRAM), double data rate (DDR) DRAM, DDR2 DRAM, DDR3 DRAM, DDR4 DRAM, and so forth. Similar to node 105, node 110 includes processor(s) 170, cache 175, link unit 120, switch fabric 140, and memory controller 130 coupled to memory 132.

In various embodiments, computing system 100 can correspond to any of various types of computer systems or computing devices, including, but not limited to, a personal computer system, desktop computer, laptop or notebook computer, computing node, supercomputer, mobile device, tablet, phone, smartphone, mainframe computer system, handheld computer, workstation, network computer, watch, wearable device, a consumer device, server, file server, application server, storage server, web server, cloud computing server, or in general any type of computing system or device or portion thereof. It is noted that the number of components of computing system 100 can vary from embodiment to embodiment. There can be more or fewer of each component/subcomponent than the number shown in FIG. 1. It is also noted that computing system 100 can include other components not shown in FIG. 1. Additionally, in other embodiments, computing system 100 can be structured in other ways than shown in FIG. 1.

Figure 2:
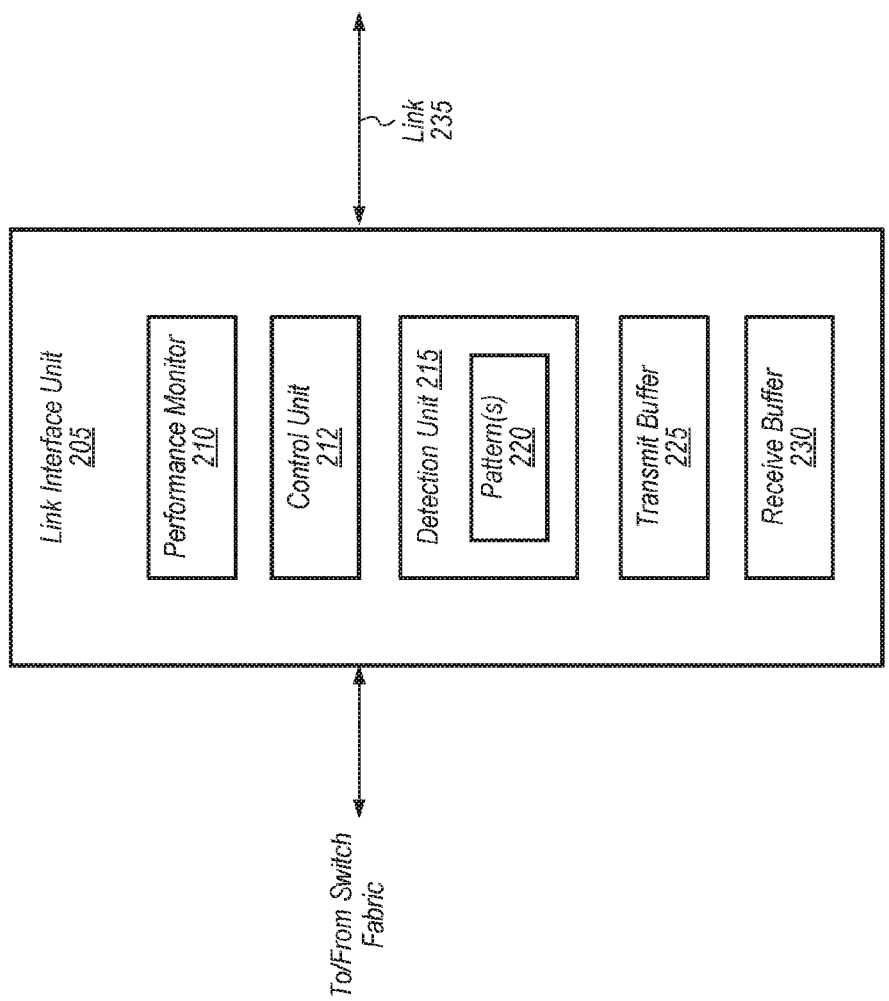
FIG. 2 is a block diagram of one embodiment of a link interface unit.

Turning now to FIG. 2, a block diagram of one embodiment of a link interface unit 205 is shown. In one embodiment, the control logic of link interface unit 205 is included in link units 115 and 120 (of FIG. 1). In one embodiment, link interface unit 205 includes performance monitor 210, control unit 212, detection unit 215, transmit buffer 225, and receive buffer 230. In other embodiments, link interface unit 205 can include other components. In various embodiments, the control logic of link interface unit 205 can be implemented using any suitable combination of software and/or hardware. Link interface unit 205 is coupled to a switch fabric (not shown) and to link 235 which is connected to one or more other components.

In one embodiment, performance monitor 210 is configured to monitor for frequently occurring data patterns in the data stream being sent over link 235. If performance monitor 210 detects a frequently occurring data pattern, performance monitor 210 sends an indication of the pattern to control unit 212. In one embodiment, control unit 212 is configured to program the pattern(s) 220 being searched for by detection unit 215. In one embodiment, detection unit 215 is configured to search for pattern(s) 220 in the data blocks stored in transmit buffer 225 which are being buffered prior to transmission over link 235. In another embodiment, pattern(s) 220 are predetermined and fixed.

In one embodiment, detection unit 215 is configured to detect if the data in transmit buffer 225 matches any of pattern(s) 220. In one embodiment, patterns 220 include multiple different sizes of data patterns. In this embodiment, detection unit 215 looks at different sizes of data blocks in transmit buffer 225 to determine if they match the different sizes of data patterns 220. If detection unit 215 finds a match for fixed portions of a cache line of data to one of data pattern(s) 220, the fixed portions are dropped from the data which is sent on link 235, and an encoding field is sent which indicates that the fixed portions were dropped and indicates which pattern the fixed portions matched. In one embodiment, control unit 212 is configured to reconstruct data which is received over link 235 and stored in receive buffer 230. For example, control unit 212 determines if fixed portions of the cache line were dropped and determines which pattern these fixed portions matched by retrieving an encoding field from receive buffer 230. Control unit 212 adds these fixed portions back to the data so as to reconstruct the original data stream.

Figure 3:
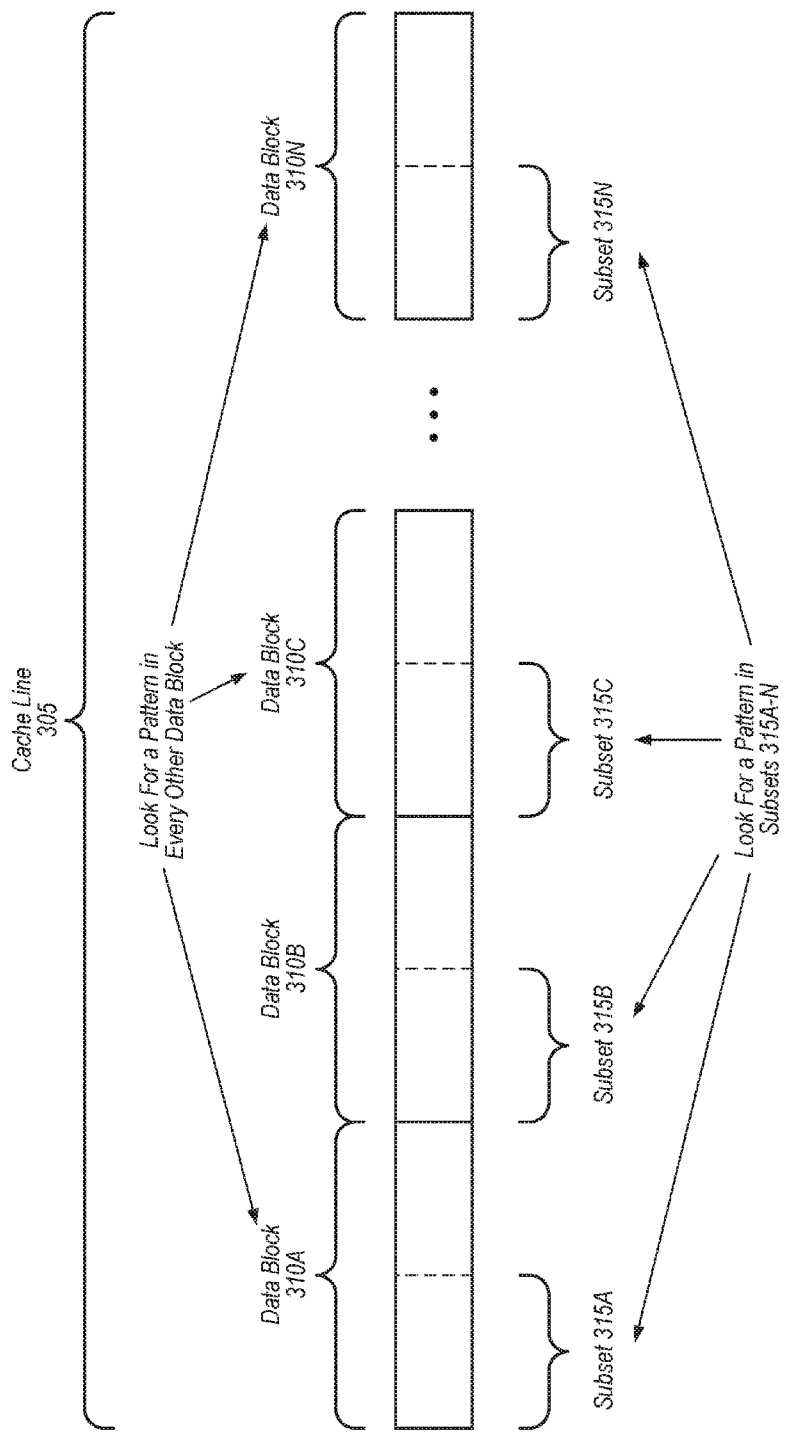
FIG. 3 is a diagram of one embodiment of a technique for compressing a cache line prior to transmission on a communication link.

Referring now to FIG. 3, a diagram of one embodiment of a technique for compressing a cache line 305 prior to transmission on a communication link. Stored within the cache line 305 are a plurality of data words, where each data word is a predetermined number of bits. It is noted that in some embodiments, the data words in cache line 305 can be one of multiple sizes. For example, in one embodiment, a processor has a 64-bit architecture but is backward-compatible with 32-bit software. Accordingly, in this embodiment, the processor is able to process both 64-bit or 32-bit software. In other embodiments, a processor can support other sizes of data words.

Cache line 305 includes a number of processor generated data blocks 310A-N, with the number of data blocks per cache line varying from embodiment to embodiment. Data blocks 310A-N are also referred to as variables or words. When the data of cache line 305 is going to be sent over a communication link (e.g., link 235 of FIG. 2), a detection unit (e.g., detection unit 215) determines if every other data block in data blocks 310A-N match one or more data patterns. The one or more data patterns include frequently used patterns, with the exact data patterns that the detection unit is looking for varying from embodiment to embodiment. If a pattern is detected in every other data block in data blocks 310A-N, then the link interface unit sends only the variable blocks of data blocks 310A-N over a communication link. If a pattern is not detected in every other data block, then the detection unit determines if subsets 315A-N match one or more data patterns. If a pattern is detected in each subset 315A-N, then the link interface unit sends only the other portions of data blocks 310A-N.

Figure 4:
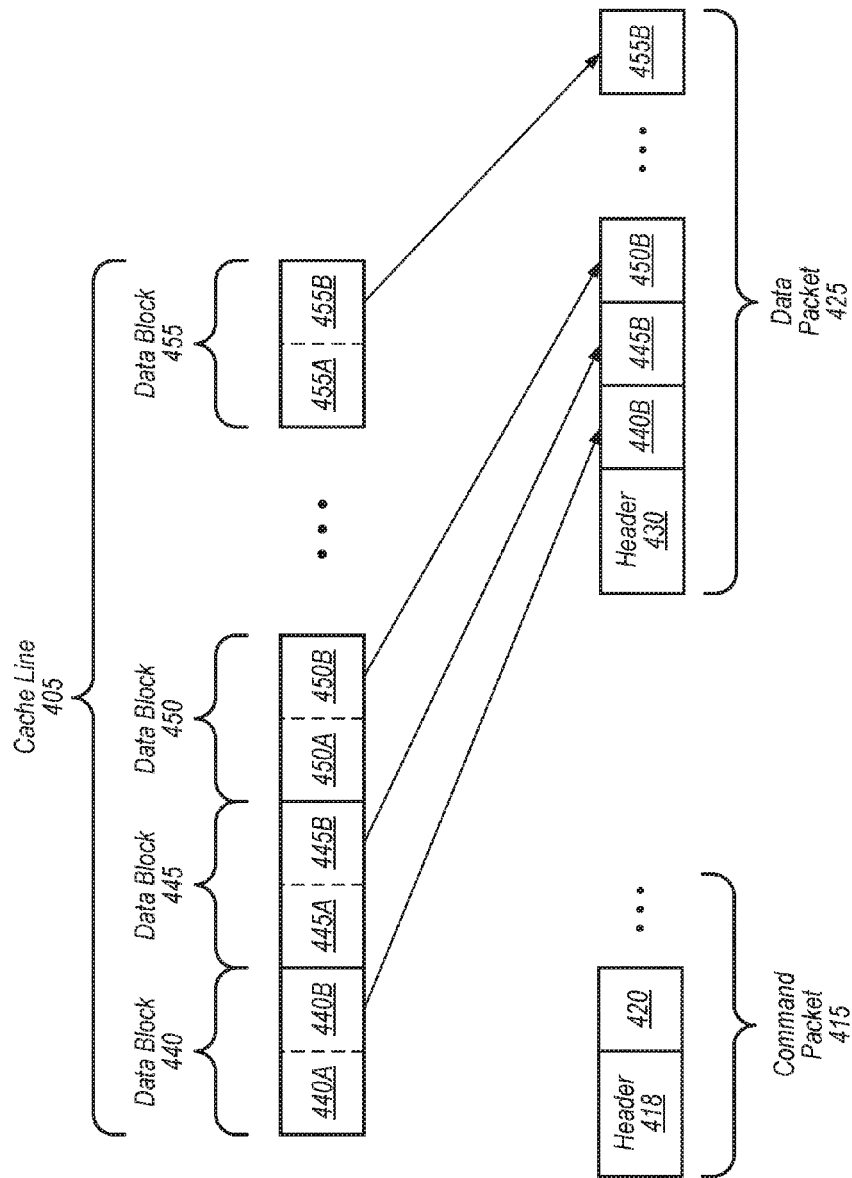
FIG. 4 is a diagram of another embodiment of a technique for compressing a cache line of data prior to transmission over a link.

Turning now to FIG. 4, a block diagram of another embodiment of a technique for compressing a cache line of data prior to transmission over a link is shown. Cache line 405 includes data blocks 440, 445, 450, and 455, which are representative of any number and size of data blocks. Cache line 405 and optionally one or more cache lines are packed into data packets to be sent over a communication link to a separate die or component.

In one embodiment, the data blocks 440, 445, 450, and 455 of cache line 405 are packed into data packet 425. Data packet 425 is representative of any size of a data packet, with the size varying from embodiment to embodiment. Data packet 425 includes a header 430 that indicates the type of packet and any additional information. In one embodiment, the data blocks of a single cache line 405 are broken into multiple data packets 425. In another embodiment, the data blocks of one or more cache lines are combined into a single data packet 425. For each data block of cache line 405, a detection unit determines if the entire data block matches one or more patterns or if a subset of the data block matches one or more patterns. In one embodiment, the subset is the upper half of the data block. In other embodiments, the subset can be other portions of the data block.

In one embodiment, the data patterns include all 1's or all 0's. For example, for small values stored in data blocks 440, 445, 450, and 455, the upper bits would be all 0's. Or for small negative values stored in data blocks 440, 445, 450, and 455, the upper bits would be all 1's using sign extension. In one embodiment, if a data pattern is detected for the subset of each data block 440, 445, 450, and 455 of cache line 405, then the subset of the data block is not included in data packet 425. This will result in a reduction in the amount of data that is sent over the communication link.

As shown in data packet 425, it is assumed that each subset 440A, 445A, 450A, and 455A of the data blocks of cache line 405 matches a frequently used pattern, and so only the other portions 440B, 445B, 450B, and 455B of the data blocks of cache line 405 are included in data packet 425. Also, it is assumed that the subsets 440A, 445A, 450A, and 455A of the data blocks are the upper halves of each data block and subsets 440B, 445B, 450B, and 455B are the lower halves of each data block. In other embodiments, data blocks can be partitioned into other sizes and/or other numbers of subsets for the purposes of detecting patterns.

In one embodiment, encoding field 420 is generated and included in command packet 415 to indicate if a pattern was detected for each data block of cache line 405 and to indicate which pattern was detected. Command packet 415 also includes a header 418 that specifies the type of packet and additional information. In one embodiment, a first encoding field indicates if a pattern was detected in the entire data block or in a subset of the data block. In one embodiment, a second encoding field indicates which pattern of a plurality of patterns was detected. In other embodiments, other numbers and types of encoding fields can be included in command packet 415 to encode if and how data blocks were compressed in data packet 425.

Referring now to FIG. 5, one embodiment of a table 500 indicating encoding fields for compressed data blocks is shown. Column 505 is a single-bit field which indicates if a pattern was detected in the cache line, with a "1" indicating a pattern was detected and "0" indicating no pattern was detected. Column 510 is a two-bit field which indicates which pattern was detected. In other embodiments, column 510 can include other numbers of bits to indicate which was pattern was detected, depending on the total number of patterns which are being searched for. Column 520 specifies the pattern for each of the encodings in column 510.

In one embodiment, an encoding of "00" is used to indicate the upper half of each data block of a first size are all 0 bits, an encoding of "01" is used to indicate the upper half of each data block of the first size are all 1 bits, an encoding of "10" is used to indicate the upper half of each data block of a second size are all 0 bits, and an encoding of "11" is used to indicate the upper half of each data block of the second size are all 1 bits. In one embodiment, the first size is 64 bits and the second size is 32 bits. In other embodiments, the first and second sizes are other numbers of bits. If the cache line matches one of these patterns, then upper halves of each block of the cache line are not included in the data packet which is sent over the communication link. When the receiver receives this data packet, the receiver utilizes the command packet to identify if a pattern was detected and which pattern was detected so that the receiver can decompress the data into its original format. In other embodiments, other encodings can be utilized to indicate if a pattern was detected and which pattern was detected. Additionally, in other embodiments, other numbers and types of patterns can be searched for among the data blocks being sent over a communication link.

In one embodiment, the combination of column 505 and 510 corresponds to encoding field 420 in command packet 415 (of FIG. 4). In this embodiment, for each cache line being sent in one or more data packets (e.g., data packet 425), the fields in column 505 and 510 are included in the command packet. The order of these fields in the command packet will match the order of the cache lines in the data packet(s).

Referring now to FIG. 6, examples of two encoding tables are shown. Table 600 is shown on the left side of FIG. 6 to represent an encoding scheme that is used in one embodiment for compressing data sent over a communication link. In this embodiment, encoding field 605 includes two bits to represent four different scenarios. If the encoding field 605 is set to "00", this indicates that no pattern was detected in the corresponding data blocks as shown in column 610 of table 600. If the encoding field 605 is set to "01", this indicates that all bits in the upper half of each data block of the cache line are equal to "0". If the encoding field 605 is set to "10", this indicates that all bits in the upper half of each data block of the cache line are equal to "1". If the encoding field 605 is set to "11", this indicates that all bits in every other data block are equal to "0". It is noted that the patterns which these encodings represent can be rearranged in other embodiments. It is also noted that patterns other than the patterns shown in table 600 can be utilized. When any of these patterns is detected in a cache line of processor generated data, the portions of the cache line matching the given pattern are dropped from the data being sent over the link. To let the receiver know which data has been dropped, the corresponding encoding field 605 is sent over the link. In one embodiment, the corresponding encoding field 605 is sent in a command packet, with encoding fields sent in an order corresponding to the order of cache lines in the data packets being sent over the link.

In one embodiment, the three patterns represented by the encodings in table 600 are expected to be frequently occurring patterns in the processor generated data that is being sent over a communication link. Accordingly, using the encoding scheme shown in table 600 could result in an efficient use of the communication link. In other embodiments, when other patterns occur more frequently than those shown in table 600, the compression scheme can be dynamically adjusted so that these other patterns can be compressed when sending processor generated data over the communication link.

Table 620, shown on the right side of FIG. 6, represents another encoding scheme that is used in another embodiment. In this embodiment, encoding field 625 includes a single bit, which represents that a pattern was detected if the bit="1" or that no pattern was detected if the bit="0". The actual pattern that is used to compress the data stream can vary from embodiment to embodiment. In one embodiment, the pattern is predetermined based on which pattern is expected to occur most frequently in the processor generated data.

In another embodiment, the pattern is dynamically determined by examining the processor generated data in real-time. In this embodiment, the pattern that is used to compress the data stream can vary over time. For example, a first pattern is used for compressing the data stream over a first period of time. Then, a performance monitor determines that a second pattern is occurring more frequently in the data stream than the first pattern. The system then switches to using the second pattern for compressing the data stream over a second period of time. In order to switch to using the second pattern, a link interface unit at a first node sends a message to a link interface unit at a second node to notify the second node that the compression scheme is switching to the second pattern for compressing data. Then, the second node updates its control logic so that data received on the link can be reconstructed properly.

Turning now to FIG. 7, one embodiment of a table 700 with pattern detection schemes implemented for different types of applications is shown. In one embodiment, a system utilizes different pattern detection schemes for different types of software applications being executed by the processors of the system. The different detection schemes are shown in column 710 of table 700 for the different application types listed in column 705. It is noted that these examples of application types and their corresponding pattern detection schemes is indicative of one embodiment. In other embodiments, other pattern detection schemes can be utilized and assigned to the different application types. Additionally, other application types can also be characterized and assigned corresponding pattern detection schemes.

In one embodiment, the determination is based on an analysis of workloads associated with the particular application. For example, an analysis of a typical workload for a given software application can be performed to determine the most likely patterns which will be stored in the processor generated data which is transferred over one or more communication links. The analysis also determines which pattern detection scheme will achieve an efficient use of the communication links. Various different pattern detection schemes can be utilized, with the schemes varying based on number of patterns searched for, whether the patterns are predetermined or dynamically determined, and/or which patterns are utilized if the patterns are predetermined, and so on.

For example, in one embodiment, a system determines that a web server application will benefit from a dynamic pattern detection scheme. The dynamic pattern detection scheme refers to dynamically determining which pattern(s) to search for in the data stream being conveyed over the communication link(s) based on which patterns occur most frequently in the data stream. The patterns which are searched for can change over time as the dynamic analysis of the data stream detects different frequently occurring patterns in different time periods. In one embodiment, the system also determines that database applications will utilize a fixed pattern detection scheme with 4 patterns being searched for, the system determines that virtualization applications will utilize a fixed pattern detection scheme with 3 patterns being searched for, and the system determines that multimedia applications will utilize a fixed pattern detection scheme with 1 pattern being searched for in blocks of the data stream. A fixed pattern detection scheme refers to a scheme with predetermined patterns being used when searching for matches in the data stream. For example, table 500 of FIG. 5 illustrates four different predetermined patterns which can be searched for in the data blocks of a data stream being conveyed over one or more communication links in accordance with one embodiment. These examples of a particular pattern detection scheme for a particular application are merely used to illustrate the ability to target a pattern detection scheme to a specific application. In other embodiments, the listed applications can utilize other types of pattern detections schemes than those shown in table 700.

Figure 8:
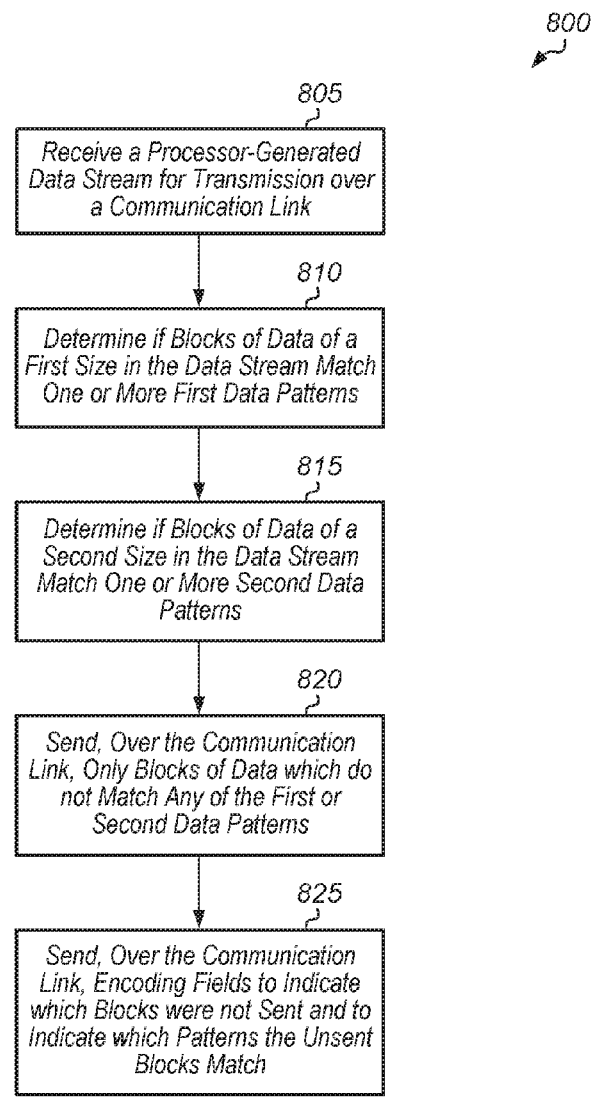
FIG. 8 is a generalized flow diagram illustrating one embodiment of a method for compressing processor-generated data.

Referring now to FIG. 8, one embodiment of a method 800 for compressing processor-generated data is shown. For purposes of discussion, the steps in this embodiment and those of FIGS. 9-12 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 800.

A link interface unit receives a processor-generated data stream for transmission over a communication link (block 805). In one embodiment, the data stream includes one or more cache lines of data from a processor cache or a cache coupled to a processor. Next, the link interface unit determines if blocks of data of a first size in the data stream match one or more first data patterns (block 810). In one embodiment, the boundaries of the blocks of data of the first size coincide with the boundaries of data words in a cache line of processor-generated data.

Also, the link interface unit determines if blocks of data of a second size in the data stream match one or more second data patterns (block 815). In one embodiment, the first size of data block is equal to twice the second size of data block. For example, in one embodiment, the first size is 64 bits and the second size is 32 bits. In this embodiment, the blocks of second size are the upper halves of blocks of the first size. In other embodiments, other first and second sizes are implemented.

The first and second data patterns include frequently occurring data patterns within the data stream. The data stream can also be referred to as a group of data. In one embodiment, the data stream is a cache line. In one embodiment, the first and second data patterns are predetermined. In another embodiment, the first and second data patterns are determined dynamically based on an analysis of one or more data streams. In a further embodiment, the first and second data patterns are determined dynamically based on the type of software application being executed by the system and/or one or more other factors.

Next, the link interface unit sends, over the communication link, only blocks of data which do not match any of the first or second data patterns (block 820). Then, the link interface unit sends, over the communication link, encodings to indicate which blocks were not sent and to indicate which patterns the unsent blocks matched (block 825). After block 825, method 800 ends.

Figure 9:
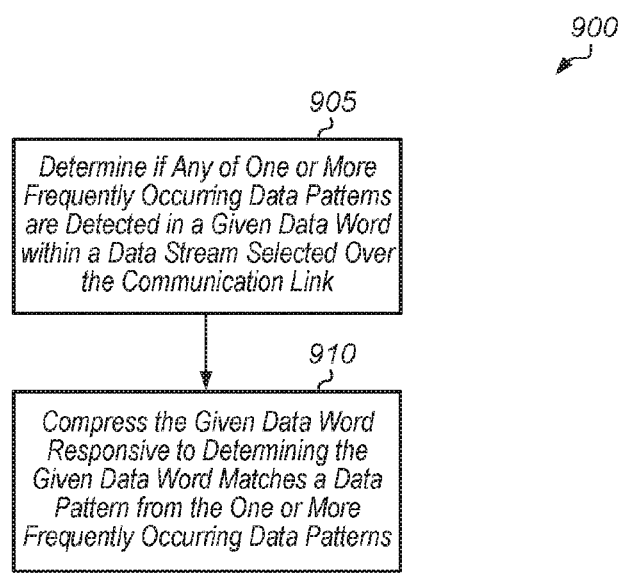
FIG. 9 is a generalized flow diagram illustrating another embodiment of a method for compressing processor-generated data.

Turning now to FIG. 9, another embodiment of a method 900 for compressing processor-generated data is shown. A system determines if any of one or more frequently occurring data patterns are detected in a given data word within a data stream selected for transmission over the communication link (block 905). In one embodiment, the data stream is generated by one or more processors of the system. In one embodiment, the given data word and/or a subset of the given data word is compared to one or more frequently occurring data patterns to determine if the given data word and/or subset matches any of the one or more frequently occurring data patterns. Next, the system compresses the given data word responsive to determining the given data word matches a data pattern from the one or more frequently occurring data patterns (block 910). Any of various compression schemes can be utilized for compressing the given data word, depending on the embodiment. After block 910, method 900 ends.

Figure 10:
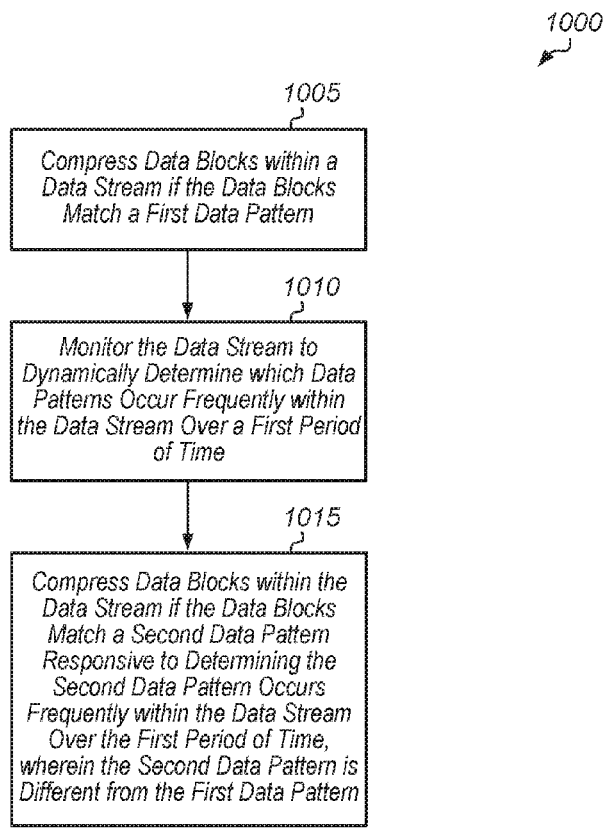
FIG. 10 is a generalized flow diagram illustrating one embodiment of a method for dynamically implementing data pattern checking of data blocks of a data stream.

Referring now to FIG. 10, one embodiment of a method 1000 for dynamically implementing data pattern checking of data blocks of a data stream is shown. A system compresses data blocks within a data stream if the data blocks match a first data pattern (block 1005). The system monitors the data stream to dynamically determine which data patterns are most frequently occurring within the data stream over a first period of time (block 1010). After the first period of time, the system compresses data blocks within the data stream if the data blocks match a second data pattern responsive to determining the second data pattern occurs frequently within the data stream over the first period of time, wherein the second data pattern is different from the first data pattern (block 1015). After block 1015, method 1000 ends. In one embodiment, it is determined that the second data pattern occurs frequently within the data stream if the second data pattern is detected more than a threshold number of times over the first period of time. The threshold and the duration of the first period of time can vary from embodiment to embodiment, and are programmable in various embodiments.

Figure 11:
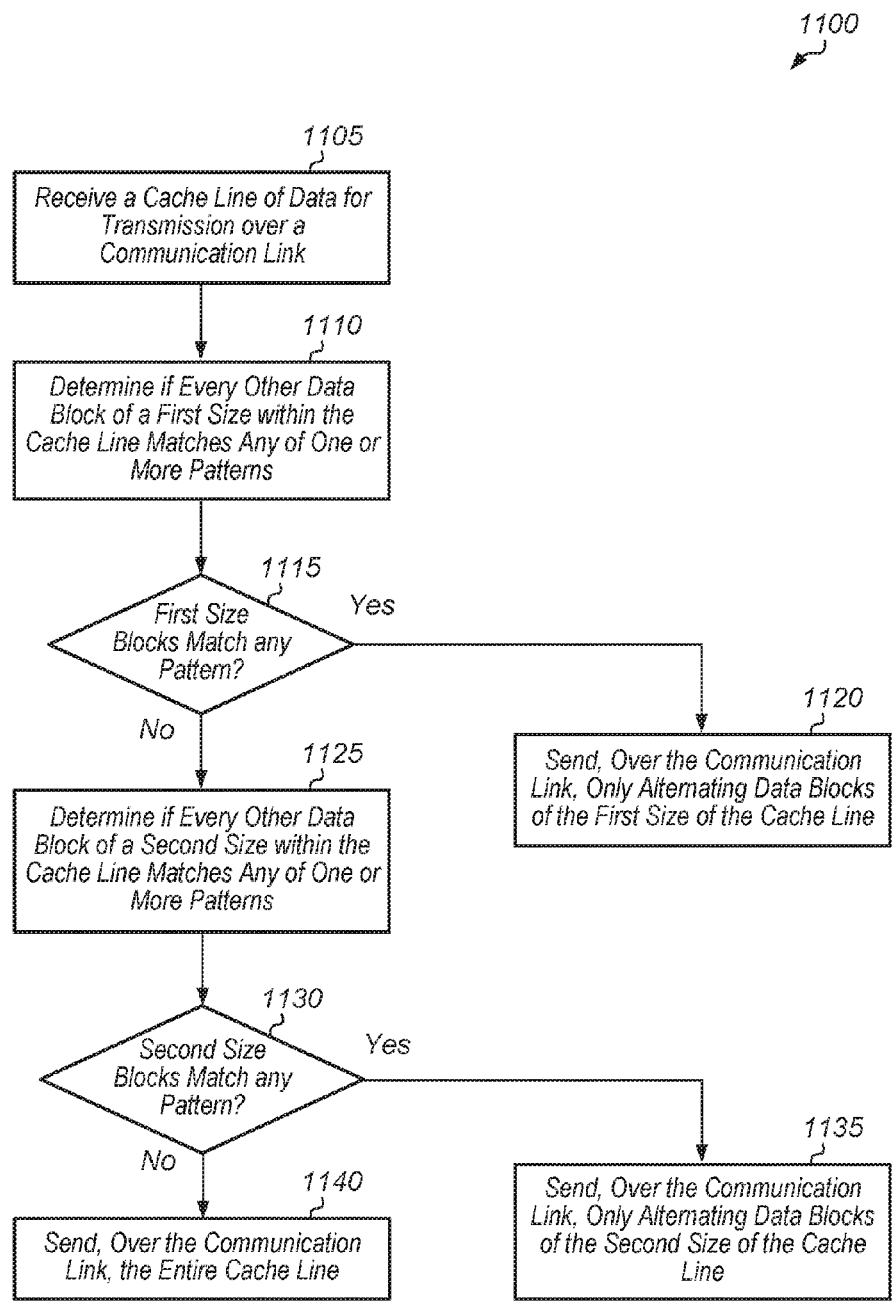
FIG. 11 is a generalized flow diagram illustrating one embodiment of a method for compressing processor-generated data.

Referring now to FIG. 11, one embodiment of a method 1100 for compressing processor-generated data is shown. A link interface unit receives a cache line of data for transmission over a communication link (block 1105). Next, the link interface unit determines if every other data block of a first size within the cache line matches any of one or more patterns (block 1110). If every other data block of the first size within the cache line matches any of one or more patterns (conditional block 1115, "yes" leg), then the link interface unit sends, over the communication link, only alternating data blocks of the first size of the cache line (block 1120). For example, if the cache line includes eight blocks, and the first, third, fifth, and seventh blocks match any of the one or more patterns (e.g., all bits equal to "0"), then only the second, fourth, sixth, and eighth blocks of the cache line are sent over the communication link. Accordingly, only half of the cache line is sent in block 1120, with every other data block of the cache line being dropped rather than being sent on the communication link. It should be understood that the blocks which are dropped are the every other blocks which matched on one of the data patterns.

If every other data block of the first size within the cache line does not match any of the one or more patterns (conditional block 1115, "no" leg), then the link interface unit determines if every other data block of a second size within the cache line matches any of one or more patterns (block 1125). In one embodiment, the second size is equal to half the first size. If every other data block of the second size within the cache line matches any of one or more patterns (conditional block 1130, "yes" leg), then the link interface unit sends, over the communication link, only alternating data blocks of the second size of the cache line (block 1135). If every other data block of the second size within the cache line does not match any of the one or more patterns (conditional block 1130, "no" leg), then the link interface unit sends, over the communication link, the entire cache line (block 1140). After blocks 1120, 1135, and 1140, method 1100 ends.

Figure 12:
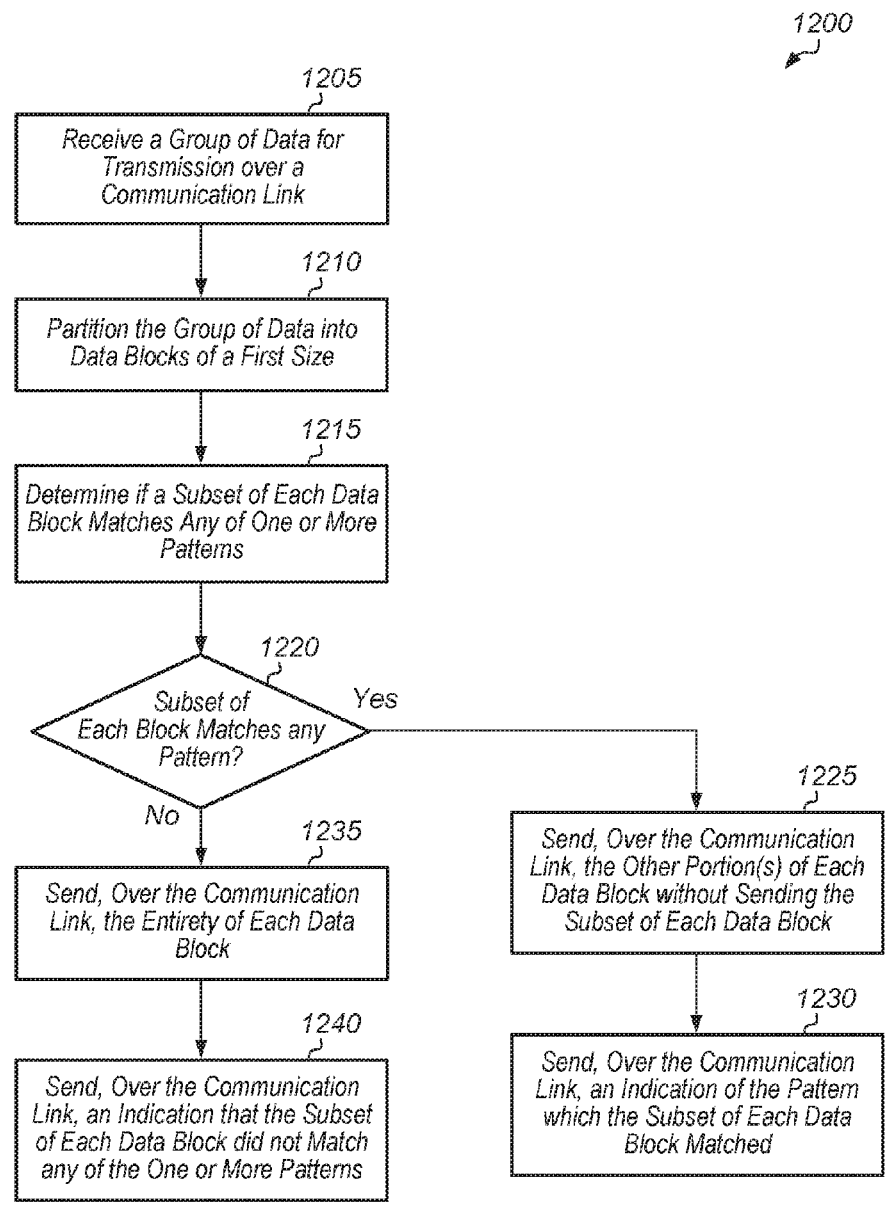
FIG. 12 is a generalized flow diagram illustrating another embodiment of a method for compressing processor-generated data

Turning now to FIG. 12, another embodiment of a method 1200 for compressing processor-generated data is shown. A link interface unit receives a group of data for transmission over a communication link (block 1205). In one embodiment, the group of data corresponds to a cache line of data from a processor's internal cache or cache coupled to the processor. The link interface unit partitions the group of data into data blocks of a first size (block 1210). In one embodiment, the first size is 64 bits. Next, the link interface unit determines if a subset of each data block matches any of one or more patterns (block 1215). In one embodiment, the subset is the upper half of the data block. In other embodiments, the subset is other portions of the data block. If the subset of each data block matches any of one or more patterns (conditional block 1220, "yes" leg), then the link interface unit sends, over the communication link, the other portions of each data block without sending the subset of each data block (block 1225). For example, if the subset is the upper half of the data block, then the link interface unit only sends the lower half of each data block over the link. Also, the link interface unit sends, over the communication link, an indication of the pattern which the subset of each data block matched (block 1230). If the subset of each data block does not match any of the one or more patterns (conditional block 1220, "no" leg), then the link interface unit sends, over the communication link, the entirety of each data block (block 1235). Also, the link interface unit sends, over the communication link, an indication that the subset of each data block did not match any of the one or more patterns (block 1240). Alternatively, if the subset of each data block does not match any of one or more patterns, then the link interface unit can partition the group of data into data blocks of a second size and perform blocks 1215-1220 again to see if a subset of each data block of a second size matches any of one or more patterns. After blocks 1230 and 1240, method 1200 ends.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
a processor;
a link interface unit; and
a communication link;
wherein the link interface unit is configured to:
receive a data stream for transmission over the communication link;
partition the data stream into blocks of data of a first size;
send, over the communication link, first portions of the blocks of data without sending second portions of the blocks of data, responsive to determining the second portions of the blocks of data match one or more first data patterns;
generate an encoding to indicate which data pattern of the one or more first data patterns the second portions match; and
send the encoding over the communication link.

2. The system as recited in claim 1, wherein responsive to determining a portion of each block of data of the first size does not match any of the one or more patterns, the link interface unit is configured to:
partition the data stream into blocks of data of a second size; and
send, over the communication link, first blocks of the blocks of data of the second size without sending second blocks of the blocks of data of the second size, responsive to determining the second blocks of the blocks of data of the second size match one or more first data patterns.

3. The system as recited in claim 2, wherein the data stream is a cache line of data, and wherein the second size is equal to half the first size.

4. The system as recited in claim 1, wherein the link interface unit is further configured to:
monitor the data stream to dynamically determine which data patterns occur frequently within the data stream over a first period of time; and
determine if blocks of data of the first size within the data stream match a second data pattern responsive to determining the second data pattern is a frequently occurring data pattern within the data stream over the first period of time, wherein the second data pattern is different from the one or more first data patterns.

5. The system as recited in claim 4, wherein a frequently occurring data pattern is a data pattern which occurs more than a threshold number of times in the first period of time.

6. The system as recited in claim 1, wherein the link interface unit is further configured to:
implement a first pattern detection scheme when compressing data associated with a first software application; and
implement a second pattern detection scheme when compressing data associated with a second software application, wherein the second pattern detection scheme is different from the first pattern detection scheme.

7. A method comprising:
receiving a data stream for transmission over a communication link;
partitioning, by a link interface unit, the data stream into blocks of data of a first size;
sending, over the communication link, first blocks of the blocks of data of the first size without sending second blocks of the blocks of data of the first size, responsive to determining the second blocks match one or more first data patterns;
generating an encoding to indicate which data pattern of the one or more first data patterns the second portions match; and
sending the encoding over the communication link.

8. The method as recited in claim 7, wherein responsive to determining a portion of each block of data of the first size does not match any of the one or more patterns, the method further comprising:
partitioning the data stream into blocks of data of a second size; and
sending, over the communication link, first blocks of the blocks of data of the second size without sending second blocks of the blocks of data of the second size, responsive to determining the second blocks of the blocks of data of the second size match one or more first data patterns.

9. The method as recited in claim 8, wherein the data stream is a cache line of data, and wherein the second size is equal to half the first size.

10. The method as recited in claim 7, further comprising:
monitoring the data stream to dynamically determine which data patterns occur frequently within the data stream over a first period of time; and
determining if blocks of data of the first size within the data stream match a second data pattern responsive to determining the second data pattern is a frequently occurring data pattern within the data stream over the first period of time, wherein the second data pattern is different from the one or more first data patterns.

11. The method as recited in claim 10, wherein a frequently occurring data pattern is a data pattern which occurs more than a threshold number of times in the first period of time.

12. The method as recited in claim 7, further comprising:
implementing a first pattern detection scheme when compressing data associated with a first software application; and
implementing a second pattern detection scheme when compressing data associated with a second software application, wherein the second pattern detection scheme is different from the first pattern detection scheme.

13. A link interface unit comprising:
one or more buffers; and
control logic;
wherein the control logic is configured to:
receive a data stream for transmission over the communication link;
store the data stream in the one or more buffers;
partition the data stream into blocks of data of a first size;
send, over the communication link, first blocks of the blocks of data of the first size without sending second blocks of the blocks of data of the first size, responsive to determining the second blocks match one or more first data patterns;
generate an encoding to indicate which data pattern the second portions match; and
send the encoding over the communication link.

14. The link interface unit as recited in claim 13, wherein responsive to determining a portion of each block of data of the first size does not match any of the one or more patterns, the link interface unit is configured to:
partition the data stream into blocks of data of a second size; and
send, over the communication link, first blocks of the blocks of data of the second size without sending second blocks of the blocks of data of the second size, responsive to determining the second blocks of the blocks of data of the second size match one or more first data patterns.

15. The link interface unit as recited in claim 14, wherein the data stream is a cache line of data, and wherein the second size is equal to half the first size.

16. The link interface unit as recited in claim 13, wherein the link interface unit is further configured to:
monitor the data stream to dynamically determine which data patterns occur frequently within the data stream over a first period of time; and
determine if blocks of data of the first size within the data stream match a second data pattern responsive to determining the second data pattern is a frequently occurring data pattern within the data stream over the first period of time, wherein the second data pattern is different from the one or more first data patterns.

17. The link interface unit as recited in claim 16, wherein a frequently occurring data pattern is a data pattern which occurs more than a threshold number of times in the first period of time.

* * * * *